United States Patent
Roujol et al.

(10) Patent No.: US 10,775,465 B2
(45) Date of Patent: Sep. 15, 2020

(54) METHOD FOR USE IN CORRECTING A MAGNETIC RELAXATION TIME CONSTANT VALUE

(71) Applicants: Siemens Healthcare GmbH, Erlangen (DE); King's College London, London (GB)

(72) Inventors: Sebastien Roujol, Kingston upon Thames (GB); Radhouene Neji, London (GB); Li Huang, London (GB)

(73) Assignees: Siemens Healthcare GmbH, Erlangen (DE); King's College, London, London (GB)

(*) Notice: Subject to any disclaimer, the term of this patent is extended or adjusted under 35 U.S.C. 154(b) by 0 days.

(21) Appl. No.: 16/668,089

(22) Filed: Oct. 30, 2019

(65) Prior Publication Data
US 2020/0132796 A1    Apr. 30, 2020

(30) Foreign Application Priority Data
Oct. 30, 2018 (EP) .................................. 18203495

(51) Int. Cl.
    *G01R 33/56*      (2006.01)
    *G01R 33/567*     (2006.01)

(52) U.S. Cl.
    CPC ..... *G01R 33/5602* (2013.01); *G01R 33/5673* (2013.01)

(58) Field of Classification Search
    CPC .................. G01R 33/5602; G01R 33/5673
    USPC .................................... 324/307, 309
    See application file for complete search history.

(56) References Cited

U.S. PATENT DOCUMENTS 8,106,655 B2 * 1/2012 Hyde ................. G01R 33/5601
                                                     324/307

OTHER PUBLICATIONS

Lee Jason J et al: "Myocardial T1 and extracellular volume fraction mapping at 3 tesla", Journal of Cardiovascular Magnetic Resonance, Biomed Central Ltd, London UK, vol. 13. No. 1.; pp. 75, XP021130939, ISSN: 1532-429X, DOI:10.1186/1532-429X-13-75; section "Methods"; 2011.
Messroghli, Daniel R. et al. "Modified Look-Locker Inversion Recovery (MOLLI) for High-Resolution T1 Mapping of the Heart" Magnetic Resonance in Medicine, vol. 52, No. 1, pp. 141-146, 2004 // DOI: 10.1002/mrm.20110.
Weingärtner, Sebastian et al. "Combined Saturation/Inversion Recovery Sequences for Improved Evaluation of Scar and Diffuse Fibrosis in Patients with Arrhythmia or Heart Rate Variability" Magnetic Resonance in Medicine, vol. 71, pp. 1024-1034, 2014 // DOI: 10.1002/mrm.24761.

(Continued)

*Primary Examiner* — Farhana A Hoque
(74) *Attorney, Agent, or Firm* — Schiff Hardin LLP (57) ABSTRACT

Techniques are disclosed for determining coefficients for use in correcting a magnetic relaxation time constant, T, value obtained via magnetic resonance imaging when a pulse rate was at a first pulse rate value to a T value reflecting the T value that would have been obtained if the pulse rate was at a second pulse rate value. The technique includes, for each region of interest, pairing an obtained derivative, m, and an obtained offset, c, as an ordered pair (c, m). The technique further includes fitting the obtained plurality of ordered pairs (c, m) to a polynomial function, and determining the values of the coefficients from the polynomial function.

17 Claims, 5 Drawing Sheets

(56) References Cited

OTHER PUBLICATIONS

Neville D. Gai et al.: "Correction for heart rate bias of post-contrast myocardial T1 values derived using MOLLI sequence", Proceedings of the International Society for Magnetic Resonance in Medicine, ISMRM, Joint Annual Meeting ISMRM-ESMRMB, Milan, Italy, May 10-16, 2014, No. 2421, XP040663490; the whole document.

Nakamori Shiro et al: "Online Appendix of "Native TI Mapping and Extracellular Volume Mapping for the Assessment of Diffuse Myocardial Fibrosis in Dilated Cardiomyopathy"", JACC: Cardiovascular Imaging, XP055583175, Retrieved from the Internet: URL:http://imaging.onlinejacc.org/content/jimg/11/1/48/DCI/embed/media-1.docx?download=true; [retrieved on Apr. 24, 2019]; the whole document; 2017.

Huang, Li et al. "Fast Myocardial T1 Mapping Using Shortened Inversion Recovery Based Schemes" Journal of Magnetic Resonance Imaging, vol. 50, No. 2, pp. 641-654, Aug. 2019 (First published: Jan. 22, 2019) // https://doi.org/10.1002/jmri.26649.

Goldfarb James W: "A Method to Remove Heart Rate Dependence with Modified Look locker Inversion Recovery (MOLL!) T1 Quantification", Proceedings of the International Society for Magnetic Resonance in Medicine, ISMRM, 20th Annual Meeting and Exhibition, Melbourne, Australia, May 5-11, 2012, XP040623660, the whole document; 2012.

Messroghli D. R. et al: "Human Myocardium: Single-Breath-hold MR T1 Mapping with High Spatial Resolution—Reproducibility Study", Radiology, vol. 238, No. 3, pp. 1004-1012, XP055070143, ISSN: 0033-8419, DOI: 10.1148/radiol.2382041903; table 4; pp. 1009, section "Physiologic Covariates as Predictors of TI Values", section "Materials and Methods"; 2006.

Chow, Kevin et al. "Saturation Recovery Single-Shot Acquisition (SASHA) for Myocardial T1 Mapping" Magnetic Resonance in Medicine, vol. 71, No. 6, pp. 2082-2095, 2014 // DOI: 10.1002/mrm.24878.

European Search Report dated May 16, 2019, Application No. 18203495.9.

* cited by examiner

METHOD FOR USE IN CORRECTING A MAGNETIC RELAXATION TIME CONSTANT VALUE

CROSS-REFERENCE TO RELATED APPLICATIONS

The present application claims the benefit of the filing date of European patent application no. EP18203495.9, filed on Oct. 30, 2018, the contents of which are incorporated herein by reference in their entirety.

TECHNICAL FIELD

The present disclosure relates to a method of determining coefficients for use in correcting a magnetic relaxation time constant, T, value, and a method of correcting the T value using the determined coefficients.

In particular the present disclosure is concerned with a method of determining coefficients for use in correcting a T value obtained via magnetic resonance imaging when a pulse rate was at a first pulse rate value to a T value reflecting the T value that would have been obtained if the pulse rate was at a second pulse rate value.

BACKGROUND

Magnetic resonance imaging based techniques for generating magnetic relaxation time constant, T, values for a subject are known. However, current techniques for generating T value shave several drawbacks.

SUMMARY

One example of the T value is the longitudinal magnetic relaxation time constant, T1. The T1 time constant is also known as the spin-lattice relaxation time constant, and is a measure of how fast the nuclear spin magnetization returns to its equilibrium state after an excitation pulse. T1 is a key source of soft tissue contrast in MRI.

Estimating T1 times and using the T1 times to generate a T1 map of an examination area provides a useful tool for a medical professional to identify diseases, lesions and abnormalities in soft tissue that affect T1. T1 mapping is useful to characterize diffuse or infiltrative myocardial diseases, including cardiomyopathies, myocarditis, and amyloidosis.

T1 mapping, and in particular cardiac T1 mapping or myocardial T1 mapping, may be performed using specific MR pulse sequences.

One such MR pulse sequence is commonly known as the Modified Look-Locker Inversion recovery (MOLLI) which may be used for myocardial T1 mapping. In an example MOLLI sequence, an inversion pulse is generated and followed by the acquisition of five images. The five images are acquired during the diastolic period of the cardiac cycle within five successive heartbeats. The diastolic period is the phase of the heartbeat when the myocardium relaxes to allow the chambers of the heart to fill with blood. After the acquisition of the five images, there is a rest period of three heartbeats, before the sequence is repeated for three heartbeats. The inversion pulse and the image acquisitions are electrocardiogram (ECG) triggered, meaning that a cardiac event as measured by an ECG apparatus triggers the generation of the inversion pulse and the image acquisitions.

Here, an "inversion pulse" means a 180 degrees excitation pulse that acts to flip the initial longitudinal magnetization of a subject's tissue to point opposite to the direction of the main (e.g., static) magnetic field.

The resultant images may then be sorted in ascending order with respect to the time after the generation of the inversion pulse, the inversion time (TI), and the signal intensity in each pixel of the image may be fit onto an apparent T1 recovery curve during a T1 fitting process. The apparent T1 recovery curve may follow a three-parameter model $S(t)=A-B \exp(-t/T1^*)$, where $S(t)$ is the signal intensity at time t after application of the inversion pulse. A, B and $T1^*$ are the parameters to be estimated by the curve fitting. $T1^*$ is the apparent recovery time rather than the actual recovery time T1. T1 can be calculated by applying the correction $T1=T1^* \times ((B/A)-1)$. In some examples, the correction $T1=T1^* \times ((B/A)-1)/C$ may be applied where C is an inversion factor of the inversion pulse. After computing the T1 time for each pixel, a T1 map for the region of interest may be generated.

Another example of the T value is the traverse magnetic relaxation time constant, T2. The T2 time constant is also known as the spin-spin relaxation time constant. T2 values may also be estimated using known magnetic resonance imaging based techniques.

A problem with existing magnetic resonance imaging techniques for generating T values is that the techniques may generate a different T value depending on the heart pulse rate of the subject. This is especially the case for inversion recovery based techniques such as MOLLI mentioned above. As the actual T value of the region being imaged is not dependent on the pulse rate of the subject, this may mean that the generated T values are even more inaccurate via this method, which is generally considered to generate inaccurate T values.

One existing approach for mitigating this problem is to use particular magnetic resonance imaging techniques that are not, or are less dependent on, the heart rate. For example, saturation pulse based techniques SAturation-recovery-Single-SHot Acquisition (SASHA) and Saturation-Pulse Prepared Heart-rate independent Inversion-REcovery (SAPPHIRE) are generally heart rate independent. Here, a saturation pulse refers to a 90-degree excitation pulse that acts to tip the initial longitudinal magnetization of a subject's tissue into the transverse magnetization plane. This method is generally considered to generate inaccurate T values.

However, these saturation pulse based techniques generally result in less precise T values as compared to inversion pulse based techniques. Robustness of generated T values to heart rate variation, has important clinical value.

Another existing approach for mitigating this problem involves correcting a T value obtained when a pulse rate of the subject was at a first pulse rate value, to a T value reflecting the T value that would have been obtained if the pulse rate was at a 'standard' pulse rate value representative of a typical heart pulse rate (e.g. 60 bpm). This correction approach involves assuming that the relationship between the T value and the heart pulse rate is linear. This approach predefines a value for the slope and offset for this linear relationship and uses these predefined slope and offset values to correct obtained T values.

The inventors of the present application have found that the slope and offset are not independent variables. Instead, the slope and offset are actually dependent on T. As such, the predefined slope and offset values used in existing approaches are limited in their effectiveness of correcting for heart rate variability in obtained T values.

It is an objective of the present disclosure to provide an improved approach for correcting for heart rate variability in obtained T values, or at least an alternative to the existing approaches.

Therefore, according to the present disclosure, there is provided a method, a computer program, and a system as described herein and in the independent claims. Other features of the disclosure are also described in the dependent claims, and the description which follows.

According to a first aspect of the disclosure, there is provided a method of determining coefficients for use in correcting a magnetic relaxation time constant, T, value obtained via magnetic resonance imaging when a pulse rate was at a first pulse rate value to a T value reflecting the T value that would have been obtained if the pulse rate was at a second pulse rate value. According to this aspect, there is provided a method of determining coefficients for use in correcting a magnetic relaxation time constant, T, value obtained via magnetic resonance imaging and corresponding to a first pulse rate value of an imaged pulsating subject (e.g. a subject imaged using a particular pulse rate), in which the corrected T value corresponds to a second pulse rate value differing from the first pulse rate value. The method comprises, for each of a plurality of different regions of interest of the imaged pulsating subject:

(i) obtaining a plurality of T values for the region of interest, each T value being associated with a different respective pulse rate value, P, to define a plurality of respective first ordered pairs (P, T);

(ii) fitting a mathematical function, F(P), to the plurality of first ordered pairs (P, T) which is monotonic thereacross, wherein the independent variable of the mathematical function is the pulse rate value, P;

(iii) determining a value of one or more derivatives of order n, $$m^{(n)} = \frac{d^n F(P)}{dP^n},$$

of the mathematical function with respect to the independent variable, P, including at least the order n=1 where n is a positive integer;

(iv) determining an intercept value, c, of the mathematical function corresponding to the independent variable, P, being equal to zero;

(v) pairing the value of a said derivative of order n and the value of the intercept, c, as a second ordered pair (c, $m^{(n)}$).

The method comprises fitting to a polynomial mathematical function of the form:

$$m^{(n)}(c) = \Sigma_{k=0}^{N} A_k^{(n)} c^k,$$

where N is a positive integer, to the obtained plurality of second ordered pairs (c, $m^{(n)}$). The method comprises determining, from the polynomial mathematical function, the values of the coefficients $A_k^{(n)}$.

Significantly, the present disclosure determines the derivative (e.g. the slope) and the intercept (also referred to as the 'offset' herein) for each of a plurality of different regions of interest. The plurality of different regions of interest each have, at the same pulse rate (e.g. 60 bpm), a different T value. These determined derivative and offset values for the different regions of interest are fitted to a polynomial function so as to determine the value of coefficients that define the relationship between the derivative and the offset. The coefficients can then be used to determine the slope and offset for correcting a particular obtained T value.

The mathematical function may be a linear function of the form:

$$F(P) = m^{(1)}P + c,$$

where $m^{(1)}$ refers to the first-order derivative of the mathematical function. In this linear function, the derivative (the slope), $m^{(1)}$, and the offset, c, are dependent on the T value. In other words, they are functions of T. As such, the slope, m, and the offset, c, may be determined for correcting a particular region of interest based on the T value obtained for that particular region of interest at a particular heart pulse rate.

The mathematical function may be a quadratic function of the form:

$$F(P) = \frac{1}{2}m^{(2)}P^2 + m^{(1)}P + c,$$

where $m^{(2)}$ refers to the second-order derivative of the mathematical function, and where $m^{(1)}$ refers to the first-order derivative of the mathematical function.

The mathematical function may be a polynomial function of the form:

$$F(P) = \sum_{n=1}^{L} \frac{1}{n!} m^{(n)} P^n + c,$$

where $m^{(n)}$ refers to the derivative of order n of the mathematical function, and where L is a positive integer.

The value of one or more derivatives of order n, is determined corresponding to the independent variable, P, being equal to zero:

$$m^{(n)} = \frac{d^n F(P)}{dP^n}\bigg|_{P=0}.$$

The T value may be a T1 value. The T value may be a T2 value.

The plurality of different regions of interest may be magnetic resonance imaging phantoms. That is, the different regions of interest may comprise different materials designed to have different T values.

The plurality of T values may be obtained using numerical simulations. That is, an actual magnetic resonance imaging operation is not required to be performed in all examples to obtain the T values, and instead computer simulation may be used to obtain simulated T values for different regions of interest/different pulse rates.

The method may comprise using the determined coefficients to correct a magnetic relaxation time constant, T, value of a subject obtained via magnetic resonance imaging when a subject pulse rate was at a first pulse rate value to a corrected T value, T', reflecting the T value that would have been obtained if the subject pulse rate was at a second pulse rate value.

The method may comprise modifying the monotonic function by substituting the derivative, m, in the monotonic function for an expression in terms of the intercept (offset), c, and the coefficients A.

The method may comprise using the obtained T value, T, the first pulse rate value, P, and the coefficients A to determine, from the modified monotonic function, a value of the intercept (offset), c, at which the modified monotonic function is equal to the T value.

The method may comprise using the determined offset c, to determine the corrected T value, T'.

As such, the offset is determined using the coefficients obtained previously and the particular T value obtained via magnetic resonance imaging of the subject. Because of this, a better correction of the T value to the correct T value, T', is provided than existing approaches, which assume that the offset is independent of the T value.

The method may include using the determined coefficients to correct a magnetic relaxation time constant, T, value corresponding to a first pulse rate value of an imaged pulsating subject, in which the corrected T value, T', corresponding to a second pulse rate value of the imaged pulsating subject differing from the first pulse rate value, the method comprising:

using the obtained T value, T, the first pulse rate value, P, and said polynomial function, $m^{(n)}(c)$, to modify the coefficients, $A_k^{(n)}$, of the polynomial function thereby to provide a modified polynomial function;

determining a root of the modified polynomial function; and using the determined root as the determined intercept value, c, in said mathematical function, F(P), to determine the corrected T value, T', corresponding to a second pulse rate value.

The mathematical function may be a linear function of the form:

$$T = (A_2^{(1)}c^2 + A_1^{(1)}c + A_0^{(1)})P + c.$$

For example, when the mathematical function (F(P)) is linear, (e.g. $F(P) = m^{(1)}P + c$) the method may include using the determined intercept (offset), c, to determine the corrected T value, T', comprising determining T' such that:

$$T' = T - \frac{P - sP}{P}(T - c),$$

where T' refers to the corrected T value,
where T refers to the obtained T value,
where P refers to the first pulse rate value,
where sP refers to the second pulse rate value, and
where c refers to the value of the intercept (offset).

Here, determining T' such that $$T' = T - \frac{P - sP}{P}(T - c)$$

does not necessarily mean that this particular form of equation must be used. For example, $T1' = (A_1 c'' + A_2 c''^{-1} + \ldots + A_{(n+1)}) \cdot sP + c$ may yield the same result.

The polynomial function may be a quadratic function of the form:

$$m^{(1)} = A_2^{(1)}c^2 + A_1^{(1)}c + A_0^{(1)}.$$

A higher order polynomial may be used as appreciated by the skilled person.

The magnetic relaxation time constant, T, may be a longitudinal magnetic relaxation time constant, T1. Each of the plurality of different regions of interest have substantially the same transverse magnetic relaxation time constant, T2, value at a given pulse rate. That is, each of the plurality of different regions of interest may have a different T1 value and substantially the same T2 value at a given pulse rate.

The method may comprise obtaining a second set of coefficients. The second set of coefficients may be obtained using the same method as mentioned above. The second set of coefficients may, however, be obtained using second plurality of regions of interest each having substantially the same T2 value at a given pulse rate. This T2 value being different to the T2 value of the plurality of regions of interest used to obtain the first set of coefficients.

In this way, two (or more) sets of coefficients may be obtained. Each may reflect a different T2 value. For example, the first set of coefficients may reflect the T2 value for blood while the second set of coefficients may reflect the T2 value for the myocardium.

The method may comprise correcting the obtained T1 value using some or all a plurality of sets of coefficients each reflecting a different T2 value. In this way, a plurality of corrected T1 values may be obtained each reflecting a different T2 value. The appropriate corrected T1 value may then be selected based on the measured or estimated T2 value of the region of the subject imaged in the process of obtaining the T1 value. For example, if the region of the subject imaged to obtain the T1 value is estimated or determined to contain blood, the corrected T1 obtained using the set of coefficients obtained from a region of interest having a T2 value corresponding to blood may be used.

The method may comprise determining whether to correct the obtained T1 value using the determined coefficients according to whether an obtained T2 value of the subject is within a predetermined range of the T2 value of the regions of interest used in determining the coefficients.

The magnetic relaxation time constant, T, may be a transverse magnetic relaxation time constant, T2. Each of the plurality of different regions of interest may have substantially the same longitudinal magnetic relaxation time constant, T1, value at a given pulse rate.

The method may comprise obtaining a second set of coefficients. The second set of coefficients may be obtained using the same method as mentioned above. The second set of coefficients may, however, be obtained using second plurality of regions of interest each having substantially the same T1 value at a given pulse rate. This T1 value being different to the T1 value of the plurality of regions of interest used to obtain the first set of coefficients.

In this way, two (or more) sets of coefficients may be obtained. Each may reflect a different T1 value. For example, the first set of coefficients may reflect the T1 value for blood while the second set of coefficients may reflect the T1 value for the myocardium.

The method may comprise correcting the obtained T2 value using some or all a plurality of sets of coefficients each reflecting a different T1 value. In this way, a plurality of corrected T2 values may be obtained, each reflecting a different T1 value. The appropriate corrected T2 value may then be selected based on the measured or estimated T1 value of the region of the subject imaged in the process of obtaining the T2 value. For example, if the region of the subject imaged to obtain the T2 value is estimated or determined to contain blood, the corrected T2 obtained using the set of coefficients obtained from a region of interest having a T1 value corresponding to blood may be used.

The method may comprise determining whether to correct the obtained T2 value using the determined coefficients according to whether an obtained T1 value of the subject is within a predetermined range of the T2 value of the regions of interest used in determined the coefficients.

The method may further comprise using the determined coefficients to correct a plurality of T values, where each of the plurality of T values represents a different pixel in a T map. The T map may be two-dimensional, but is not limited to two-dimensions and may be three-dimensional, for example.

According to a second aspect of the present disclosure, there is provided a method of correcting a magnetic relaxation time constant, T, value obtained via magnetic resonance imaging when a pulse rate of a subject was at a first pulse rate value to a corrected T value, T', reflecting the T value that would have been obtained if the pulse rate of the subject was at a second pulse rate value.

The method comprises:

obtaining coefficient values $A_1, A_2, \ldots, A_n, A_{n+1}$, of a polynomial function of the form $m=A_1c^n + A_2c^{n-1}+ \ldots +A_{n+1}$, where m refers to a derivative of a monotonic mathematical function, and where c refers to an intercept or offset of the mathematical function, where the dependent variable of the mathematical function is the T value, and where the independent variable of the mathematical function is the pulse rate value, P.

The method comprises modifying the mathematical function by substituting the derivative, m, in the mathematical function for an expression in terms of the intercept (offset), c, and the coefficients $A_1, A_2, \ldots A_{n+1}$.

The method comprises using the obtained T value, T, the first pulse rate value, P, and the coefficients $A_1, A_2, \ldots A_{n+1}$ to determine, from the modified mathematical function, a value of the offset, c, at which the modified mathematical function is equal to the T value.

The method comprises using the determined offset c, to determine the corrected T value, T'.

According to a third aspect of the present disclosure, there is provided a computer readable medium having instructions recorded thereon which, when executed by a computer, cause the computer to perform the method as described above in relation to the first or second aspect of the disclosure.

According to a fourth aspect of the present disclosure, there is provided an apparatus for performing the method as described above in relation to the first or second aspect of the disclosure. The apparatus may be a magnetic resonance (MR) apparatus.

BRIEF DESCRIPTION OF THE DRAWINGS

Examples of the present disclosure will now be described with reference to the accompanying drawings, in which.

DETAILED DESCRIPTION

Figure 1:
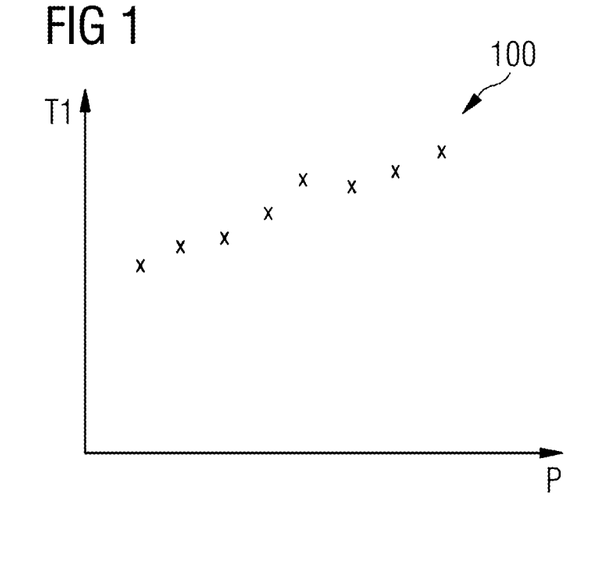
FIG. 1 shows an example plot of T1 values against pulse rates according to aspects of the present disclosure.

Referring to FIG. 1, there is shown an example plot 100 of longitudinal magnetic relaxation time constant, T1, values for a region of interest recorded at different pulse rates, P. In this example, it can be seen that the obtained T1 values for a region of interest indicated by 'x' in FIG. 1 vary based on the pulse rate. In this example, the T1 value increases as the pulse rate increases.

This variation in the T1 value is not caused by a change in tissue properties within the region of interest, but is instead caused by the susceptibility of the magnetic resonance imaging sequences used to obtain T1 values to heart rate variability.

To increase the clinical relevance of the obtained T1 value, the obtained T1 value is corrected to a T value reflecting the T value that would have been obtained if the pulse rate was at a second pulse rate value. The second pulse rate may be a standard pulse rate value used by clinicians. The second pulse rate value will be referred to as 60 heartbeats per minute (bpm) in the following examples, but it will be appreciated that other second pulse rate values may be used. For example, the second pulse rate value could be between 40 to 140 bpm, 40 to 120 bpm, 40 to 100 bpm, 40 to 80 bpm, 40 to 60 bpm, etc. As another example, the second pulse rate value could be between 60 to 140 bpm, 80 to 140 bpm, 100 to 140 bpm, 120 to 140 bpm, etc.

It can be seen in FIG. 1 that the T1 value increases monotonically with the pulse rate. This means that a monotonic mathematical function with the T1 value as the independent variable and the pulse rate value, P, as the dependent variable may be defined.

The monotonic function comprises a derivative, m, of the dependent variable, T, with respect to the independent variable, P. The monotonic function also comprises an intercept (also referred to interchangeably as an 'offset'), c, corresponding to the T1 value when the independent variable, P, being equal to zero.

In one example, the monotonic function is a linear function. That is, the T1 value is expressed in terms of the derivative, m, and the offset c, i.e. $T1=m\times P+c$.

Other forms of monotonic function may have higher order differentials such as:

$$T1 = F(P) = \sum_{n=1}^{L} \frac{1}{n!} m^{(n)} P^n + c \text{ where}$$

$$m^{(n)} = \frac{d^n F(P)}{dP^n}$$

In accordance with the present disclosure it has been realised that the derivative, m, and the offset, c, vary as a function of the determined T1 value. This means that a predefined offset used for subsequently correcting obtained T1 values generally results in low precision heart rate correct. The present disclosure provides a different approach or correcting T1 values.

The present disclosure provides a calibration stage during which coefficients are determined. The coefficients are for use in correcting a magnetic relaxation time constant, T1, value obtained via magnetic resonance imaging when a pulse rate was at a first pulse rate value to a T1 value reflecting the T1 value that would have been obtained if the pulse rate was at a second pulse rate value.

Figure 2:
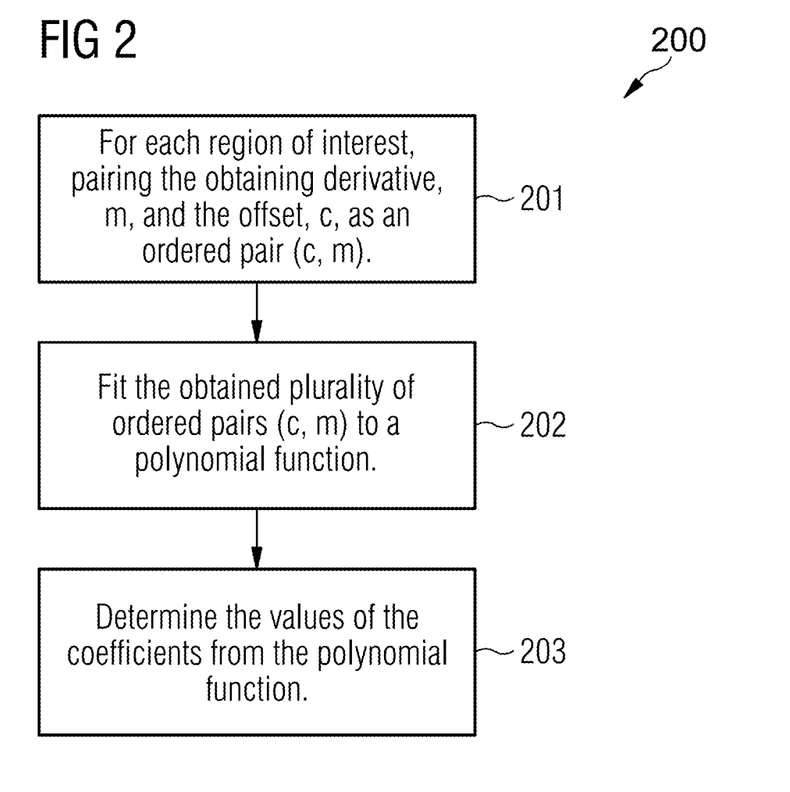
FIG. 2 shows an example flow diagram according to aspects of the present disclosure.

FIG. 2 shows an overview of a method 200, which may comprise the calibration stage. The calibration stage thus comprises three main steps 201, 202, 203.

The method 200 may include obtaining or calculating (block 201) a derivative value, m, and an offset value, c, for each of a plurality of regions of interest. This results in the generation of an ordered pair (c, m) for each region of interest.

Generally, each region of interest has a different T1 value at the second pulse rate value of a typical heart pulse rate, say 60 bpm. Each region of interest has substantially the same T2 value at the second pulse rate value.

The method 200 may further include fitting (block 202) the obtained plurality of ordered pairs (c, m) to a polynomial function. In an aspect, the polynomial function is of the form:

$$m = m^{(n)}(c) = \sum_{k=0}^{N} A_k^{(n)} c^k$$

where n=1 representing the first-order derivative, and N is a positive integer.

The method 200 may also include determining (block 203) the values of the coefficients $A_k^{(n)}$ from the polynomial function.

Figure 3:
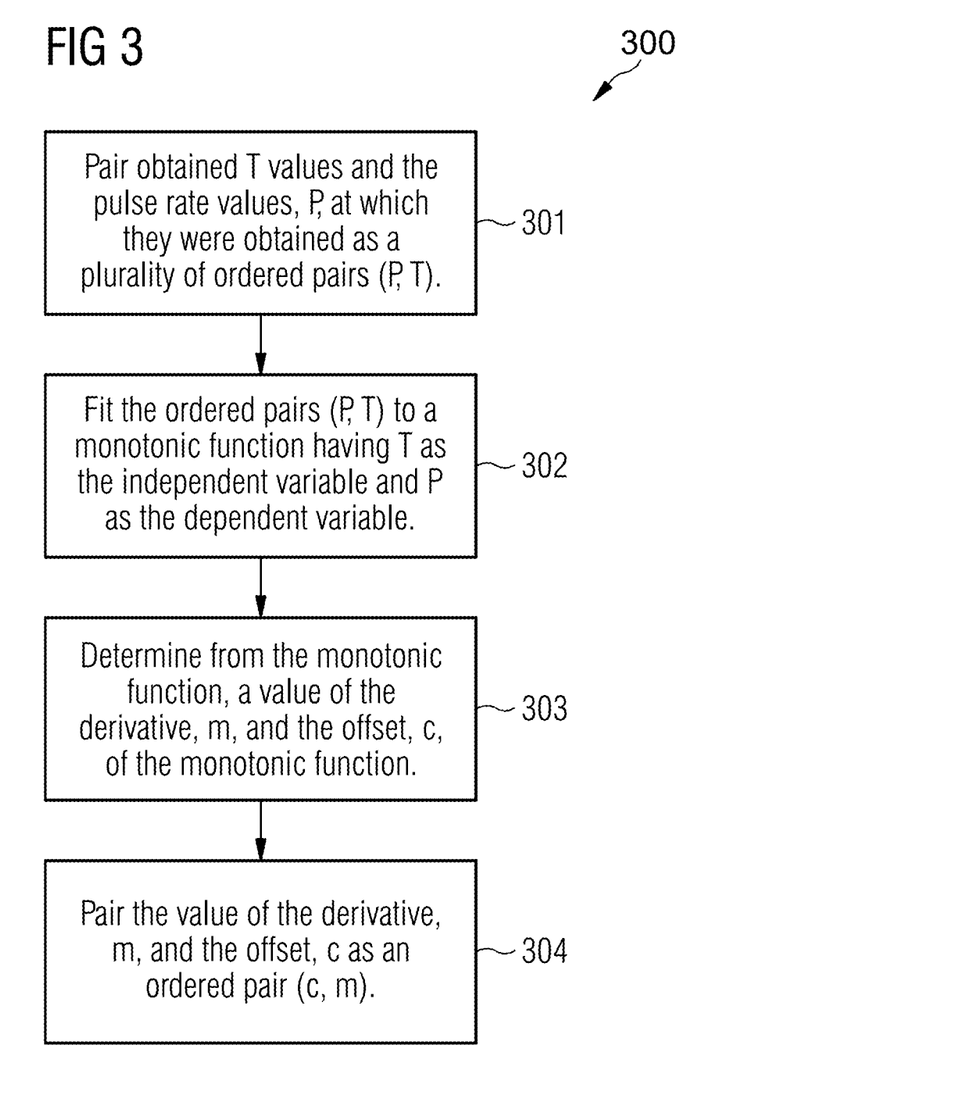
FIG. 3 shows another example flow diagram according to aspects of the present disclosure.

FIG. 3 shows a method 300, which illustrates a detailed overview of step 201 of the calibration stage in 201 as performed for each region of interest.

The method 300 includes pairing (block 301) the T1 values obtained for the region of interest and the pulse rate values, P, at which they were obtained to obtain a plurality of ordered pairs (P, T).

The method 300 further includes fitting (block 302) the ordered pairs (P, T) to a monotonic function having T as the dependent variable and P as the independent variable.

The method 300 also includes determining (block 303) a value of the derivative, m, of the dependent variable, T, with respect to the independent variable, P from the monotonic function. A value of the intercept (offset), c, of the monotonic function corresponding to the independent variable, P, being equal to zero is also determined (block 303).

The method 300 further includes pairing (block 304) the value of the derivative, m, and the value of the intercept (offset), c, as a second ordered pair (c, m).

An example calibration stage will now be described through reference to the plots shown in FIGS. 4a to 5.

Figure 4A:
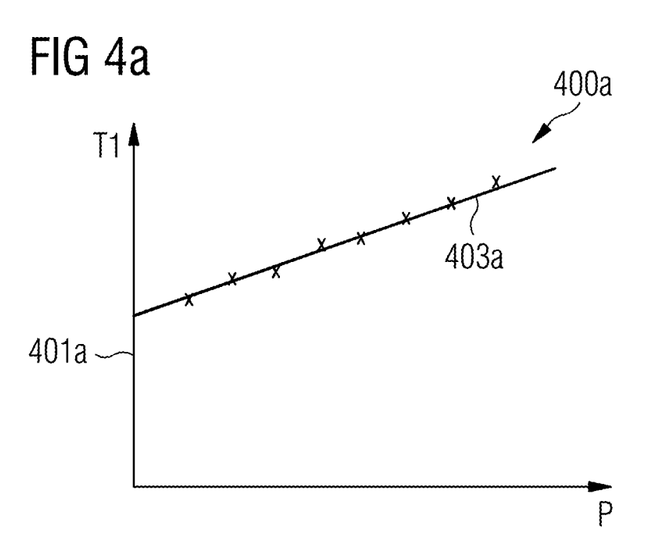
FIGS. 4a-4c show further example plots of T1 values against pulse rates according to aspects of the present disclosure
Figure 4B:
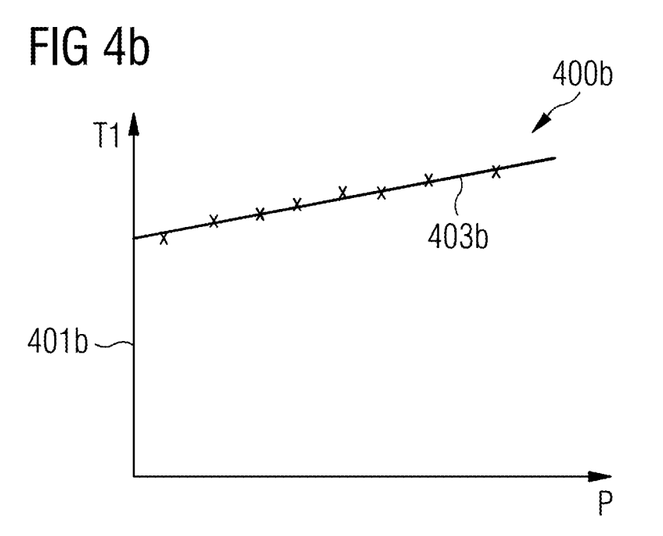
Figure 4C:
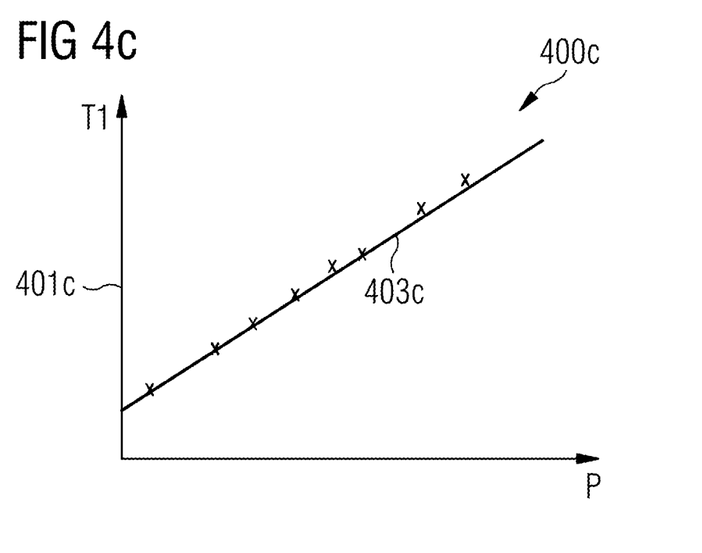

Referring to FIGS. 4a to 4c, there are shown example plots example plots 400a, 400b, 400c, of T1 values for three different regions of interests obtained over a range of different pulse rates.

FIG. 4a shows an example plot 400a of T1 values obtained over a range of pulse rates, P, for a first region of interest. The first region of interest has a first T1 value at the second pulse rate value of a typical heart pulse rate, e.g. 60 bpm. The T1 values and the corresponding pulse rate, P, at which they were obtained are paired to define a plurality of ordered pairs (P, T1). For example, if T1 values were obtained at five different pulse rates, five ordered pairs would be defined $\{(P_1, T1_1), (P_2, T1_2), (P_3, T1_3), (P_4, T1_4), (P_5, T1_5)\}$.

The obtained ordered pairs $(P_n, T1_n)$ are fitted to a linear function as indicated by the line 403a superimposed over the ordered pairs in the plot of FIG. 4a. The linear function is of the form:

$T1 = m \times P + c$

Thus, the dependent variable of the linear function is the T1 value, and the independent variable of the linear function is the pulse rate value, P.

Here, m denotes the value of the derivative of first order (i.e. the slope) of the dependent variable T1, with respect to the independent variable P. Further, c denotes the value of the intercept (offset), c, of the monotonic function corresponding to the dependent variable, P, being equal to zero. The intercept (offset) is indicated by the reference numeral 401a in FIG. 4a.

The value of the slope, m, and the intercept (offset), c, are determined from the linear function and paired together to form an ordered pair $(m_1, c_1)$.

FIG. 4b shows an example plot 400b of T1 values obtained over a range of pulse rates, P, for a second region of interest. The second region of interest has a second T1 value at the second pulse rate value of a typical heart pulse rate, e.g. 60 bpm.

Again, the T1 values and the corresponding pulse rates at which they were obtained form ordered pairs, which are fitted to a linear function as indicated by the line 403b in FIG. 4b. The value of the first-order derivative, m, and the intercept (offset)t c, are obtained from the linear function form an ordered pair $(m_2, c_2)$. The intercept (offset) is indicated by the reference numeral 401b in FIG. 4b.

FIG. 4c shows an example plot 400c of T1 values obtained over a range of pulse rates, P, for a third region of interest. The third region of interest has a third T1 value at the second pulse rate value of a typical heart pulse rate, e.g. 60 bpm.

Again, the T1 values and the corresponding pulse rates at which they were obtained form ordered pairs which are fitted to a linear function as indicated by the line 403c in FIG. 4c. The value of the first-order derivative, m, and the intercept (offset), c, are obtained from the linear function form an ordered pair $(m_3, c_3)$. The intercept (offset) is indicated by the reference numeral 401c in FIG. 4c.

The three regions of interest result in three ordered pairs $\{(m_1, c_1), (m_2, c_2), (m_3, c_3)\}$.

Significantly, the values of the slope, m, and the offset, c, are dependent on the T1 value. This can be appreciated from FIGS. 4a to 4c, because each of the plots for the three regions of interest has a different slope, m, and offset, c. This highlights that the slope, m, and the intercept (offset), c, are dependent on the T1 value.

Figure 5:
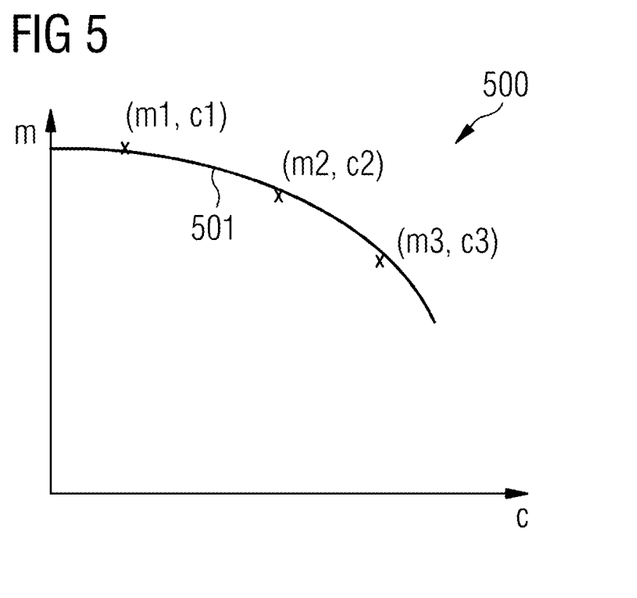
FIG. 5 shows an example plot of determined derivative values against offset values according to aspects of the present disclosure.

FIG. 5 shows an example plot 500 of the obtained three ordered pairs $\{(m_1, c_1), (m_2, c_2), (m_3, c_3)\}$. From this plot, it can be seen that there is a relationship between the slope, m, and the intercept (offset), c. This relationship may be represented by a polynomial function as indicated by the curve 501. In this example, the polynomial function is a quadratic equation of the form:

$$m = m^{(1)}(c) = \sum_{k=0}^{N} A_k^{(1)} c^k$$

in general, or in this particular example (N=2):

$m = A_2 c^2 + A_1 c + A_0$

Here, $A_1$, $A_2$, and $A_3$ are the coefficients to be determined. The values of the coefficients are determined using the polynomial function. For example, the values of the coefficients may be obtained using a least squares fitting procedure.

As a result of the calibration stage, values of the coefficients $A_1$, $A_2$, and $A_0$ are determined. The coefficients define the relationship between the slope, m, and intercept (offset), c, values.

Significantly, the calibration stage may be performed using phantoms or even numerical simulations. The obtained coefficients may then be used to correct T1 values for a number of different subjects. This is because the present disclosure exploits the realisation that this relationship between slope, m, and intercept (offset), c, holds for different T1 values. A benefit of this is that extensive magnetic resonance imaging of the subject is not required, which can not only be expensive but also stressful for the subject.

The present disclosure further provides a correction stage for correcting a magnetic relaxation time constant, T1, value obtained for a subject via magnetic resonance imaging when a pulse rate was at a first pulse rate value to a T1 value reflecting the T1 value that would have been obtained if the pulse rate was at a second pulse rate value.

In an example correction procedure, a subject is imaged to obtain T1 values which are generally arranged to form a 2D T1 map. The T1 map could be of a myocardial region of the subject, for instance. The obtained T1 values are then corrected using the coefficients determined in the calibration stage mentioned above.

For the correction stage, the obtained (uncorrected) T1 value and the pulse rate of the subject when the T1 value was obtained are known. The pulse rate may be measured using an ECG or other similar approach for measuring the pulse rate.

The correction stage also knows that there is a monotonic relationship between the T1 value and the pulse rate. In one example, the monotonic function is a linear function of the form:

$$T1 = m \times P + c.$$

Here, T1 is the obtained T1 value, P is the known pulse rate of the subject when the T1 value was obtained. Here, m refers to the first-order derivative which is currently unknown, and c refers to the intercept (offset) which is currently unknown.

The objective of the correction stage is to correct the T1 value to a corrected T1 value, T1' that reflects the T1 value that would have been obtained if the pulse rate was at the second pulse rate value of, e.g. 60 bpm.

This means that the correction stage involves solving the equation:

$$T1' = m \times 60 + c,$$

Figure 6:
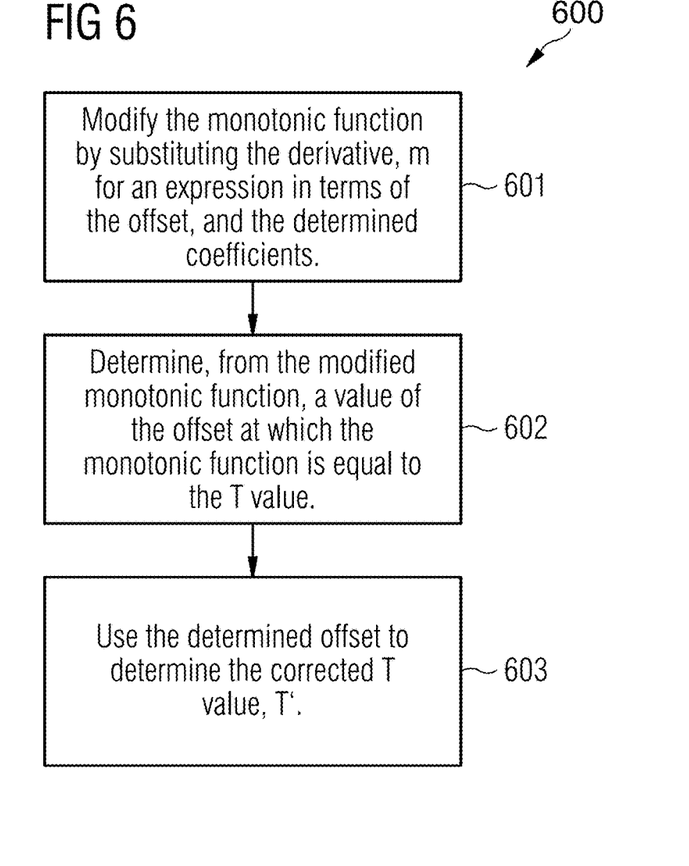
FIG. 6 shows another example flow diagram according to aspects of the present disclosure.

Referring to FIG. 6, there is shown an overview of a method 600, which may comprise the correction stage. The correction stage thus comprises three main steps 601, 602, 603.

The method 600 may include modifying (block 601) the monotonic function by substituting the first-order derivative, m, in the monotonic function for an expression in terms of the intercept (offset), c, and the coefficients $A_1$, $A_2$, $A_0$.

In the example of the linear function for T1 (T1=m×P+c) and the quadratic function for m ($m = A_2 c^2 + A_1 c + A_0$), the modified monotonic function is thus:

$$T1 = (A_2 c^2 + A_1 c + A_0) \times P + c$$

Here, T1, P and the coefficients $A_1$, $A_2$, $A_0$ are known.

The method 600 may further include determining (block 602) from this modified monotonic function, a value of the intercept (offset), c, at which the monotonic function is equal to the T value. As will be appreciated in the above example, the only unknown in the above equation is the intercept (offset), c. The value of the intercept (offset), c, may be determined using any appropriate numerical or analytical method as appreciated by the skilled person.

For example, the modified monotonic function may be rearranged to form the equation:

$$(A_2 c^2 + A_1 c + A_0) \times P + c - T1 = 0$$

Or, in other words:

$$A_2 c^2 + \left(A_1 + \frac{1}{P}\right) \times c + \left(A_0 - \frac{T1}{P}\right) = 0$$

The value of c can then be determined by finding the positive root of the above equation, e.g. by determining:

$$c = \frac{-\left(A_1 + \frac{1}{P}\right) \pm \sqrt{\left(A_1 + \frac{1}{P}\right)^2 - 4A_2\left(A_0 - \frac{T1}{P}\right)}}{2A_2}$$

It has been found that only the positive root leads to physiologically reasonable c values. Method 600 further includes using (block 603) the determined intercept (offset), c, to determine the corrected T value, T'.

For example, an expression of the corrected T value, T', in terms of T1 value, the first pulse rate value when the T1 value was obtained, the second pulse rate value, and the offset, c, can be obtained in the following way:

$$T1 = m \times P + c$$

$$T1' = m \times 60 + c$$

$$T1' = \left(\frac{T1-c}{P}\right) \times 60 + c \frac{T1-c}{P} \times 60 + c =$$

$$\frac{60}{P}T1 + \frac{(P-60)}{P}c = T1 - \frac{P-60}{P}(T1-c)$$

Alternatively, an expression of the corrected T value, T', in terms of the T1 value, the coefficients $A_2$, $A_1$, $A_0$, the second pulse rate value, and the intercept (offset), c, can be obtained in the following way:

$$m = A_2 c^2 + A_1 c + A_0$$

$$T1' = m \times 60 + c = (A_2 c^2 + A_1 c + A_0) \cdot 60 + c$$

Both expressions of T1' are mathematically identical and thus equivalent ways of determining T1'.

The above example method for correcting the T1 value may be performed for each pixel of the obtained T1 map such that a corrected T1 map may be obtained.

It can be appreciated that different pixels of the T1 map may be associated with subject tissue having different T2 values. For example, some regions of the T1 map may relate to the myocardium while other regions of the T1 map may relate to blood. The myocardium usually has a short T2 value, and the blood usually has a longer T2 value.

In view of this, a plurality of different sets of coefficients may be determined. Each of the sets of coefficients may be obtained using regions of interest having a different T2 value at a particular pulse rate.

For example, two sets of coefficients may be determined. A first set of coefficients may be obtained using a region of interest which has a short T2 value, reflecting the T2 value of the myocardium. A second set of coefficients may be obtained using a region of interest which has a long T2 value, reflecting the T2 value of blood.

The T1 value may be corrected, separately, using both sets of coefficient values. This may result in the generation of two corrected T1 values. One T1 value corrected for a short T2 value, while the other T1 value corrected for a long T1 value.

In an alternative approach, the pixel of the T1 map may be analysed to estimate its T2 value. For example, the pixel of the T1 map may be processed to determine whether it has the visual properties of the myocardium or the blood. Based on this determination, an appropriate set of coefficient values may be selected for correcting the T1 value. This approach may result in the generation of only a single corrected T1 value.

The above example refers to the correction of obtained T1 values. The present method also applies to the correction of obtained T2 values. That is, in the above examples, the skilled person will appreciate that the term T1 may be substituted for T2, and vice versa.

The above examples refer to the monotonic function being a linear function of the form T1=m×P+c. This is by way of example and not limitation, and not required in all embodiments. Any suitable type of other monotonic mathematical functions are within the scope of the present disclosure. For example, the monotonic function may be any monotonic function of the form (L=positive integer):

$$T1 = F(P) = \sum_{n=1}^{L} \frac{1}{n!} m^{(n)} P^n + c$$

An example is:

$$T1 = F(P) = \frac{1}{2} m^{(2)} P^2 + m^{(1)} P + c$$

The above examples refer to the polynomial function being a quadratic function of the form $m = A_2 c^2 + A_1 c + 0$. However, this is by way of example and not limitation and is not required in all embodiments. Any suitable type of other polynomial functions are within the scope of the present disclosure. Moreover, any suitable type of polynomial function of the following form is within the scope of the present disclosure (N=positive integer):

$$m^{(n)}(c) = \sum_{k=0}^{N} A_k^{(n)} c^k$$

The value of derivatives, $m^{(n)}$, of order n, may be determined corresponding to the independent variable, P, being equal to zero:

$$m^{(n)} = \frac{d^n F(P)}{dP^n}\bigg|_{P=0}.$$

In this sense, the mathematical function may be expressed in terms of a so-called 'Taylor Expansion' of itself, from the intercept point (P=0).

As an illustrative example, consider the following set of equations:

$$T1 = F(P) = \frac{1}{2} m^{(2)} P^2 + m^{(1)} P + c \text{ where}$$

$$m^{(1)}(c) = \sum_{k=0}^{N} A_k^{(1)} c^k \text{ and, where}$$

$$m^{(2)}(c) = \sum_{k=0}^{M} A_k^{(2)} c^k$$

Here, let M=N for simplicity. Re-arranging the first equation gives:

$$0 = \frac{1}{2} m^{(2)} P^2 + m^{(1)} P + (c - T1)/P$$

Substituting the full expressions for the derivatives (m) into this last equation gives:

$$0 = \frac{1}{2} P^2 \sum_{k=0}^{N} A_k^{(2)} c^k + P \sum_{k=0}^{N} A_k^{(1)} c^k + (c - T1)/P$$

The values of P and T1 are known values obtained from measurements and the coefficients $A_k^{(2)}$ and $A_k^{(1)}$ are known from curve-fitting to measurements of $m^{(1)}(c)$, and $m^{(2)}(c)$, each when plotted as functions of measured values of c. The above equation is an Nth order polynomial in the variable 'c'. The root of this polynomial equation we shall denote as $c_0$. The root of the equation may be found analytically (e.g. if N=2) or numerically. Once this root ($c_0$) is found, it may be used as follows.

Given that, for an arbitrary P value, we have:

$$T1 = \frac{1}{2} m^{(2)} P^2 + m^{(1)} P + c$$

For a selected 'reference' value denoted here as $P_{ref}$ (e.g. 60 bpm), we have:

$$T1_{ref} = \frac{1}{2} m^{(2)} P_{ref}^2 + m^{(1)} P_{ref} + c$$

Here we have used the term $T1_{ref}$ in association with $P_{ref}$, but in earlier examples above, the quantity T' is synonymous with $T1_{ref}$. Thus, $$\frac{T1 - T1_{ref}}{P - P_{ref}} = \frac{1}{2} m^{(2)} (P - P_{ref}) + m^{(1)} \text{ and}$$

$$\frac{T1 - c}{P} - \frac{1}{2} m^{(2)} P^2 = m^{(1)}$$

Combining these two equations and rearranging for $T1_{ref}$ gives, $$T1_{ref} = T1 + (T1 - c_0)\frac{P - P_{ref}}{P} - \frac{1}{2}m^{(2)}(c_0)(P - P_{ref})P_{ref}$$

Here the root $c_0$, of the polynomial is the value used for the intercept/offset variable c. The term $m^{(2)}(c_0)$ denotes the value of the second order differential as evaluated using the root $c_0$. This allows the corrected value $T1_{ref}$ (also referred to as T' in other examples above) to be obtained. It will be seen that if the second order differential ($m^{(2)}(c_0)$) is ignored/neglected, then the above equation reduces to the earlier expression derived above when the mathematical function is assumed to be purely linear.

Figure 7:
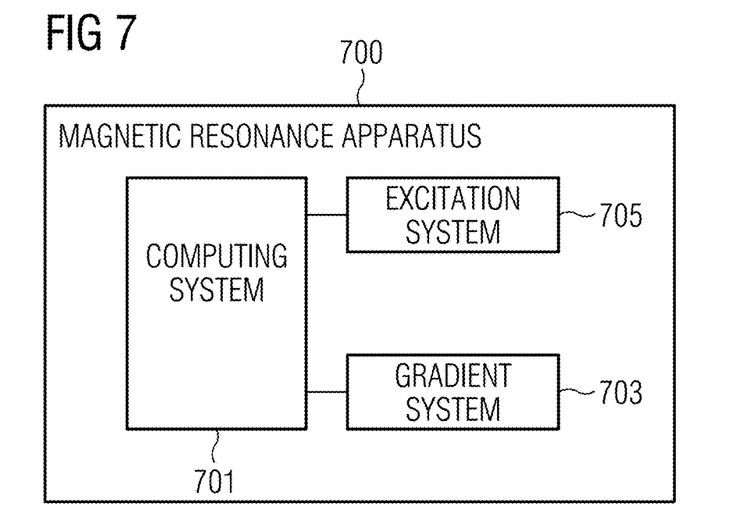
FIG. 7 shows an example magnetic resonance apparatus according to aspects of the present disclosure.

Referring to FIG. 7, there is shown an example MR apparatus 700 according the second aspect of the disclosure. The MR apparatus 700 comprises a computing system 701, a gradient system 703, and an excitation system 705.

The gradient system 703 is configured to apply a magnetic field gradient. The gradient system 703 may be configured to apply magnetic field gradients along three spatial axes.

The excitation system 705 may comprise a transmitter (not shown) and a receiver (not shown). The excitation system 705 can be an RF system with one or more RF coils (not shown). The excitation system 705 is configured to apply an excitation pulse to the subject and to receive signals from the subject.

The MR apparatus 700 includes a magnet (not shown) for establishing a stationary magnetic field. The magnet can include a permanent magnet, a superconducting magnet or other suitable type of magnet.

The computing system 701 is in communication with the excitation system 705 and the gradient system 703 for controlling these components. The computing system 701 is configured to receive the signals from the excitation system 705.

The computing system 701 may further include or access a computer-readable memory (e.g. non-transitory computer-readable memory) having instructions stored thereon in the form or executable program code, for instance. The computing system 701 is further configured to execute such program code to control the gradient system 703 and the excitation system 705 to generate a MR pulse sequence. The MR pulse sequence may be a pulse sequence for obtaining MR images for use in estimating T1 times in accordance with the present disclosure.

The computing system 701 is also configured to execute the program code to process the MR images so as to estimate the T1 time, and correct the T1 time to a standard pulse rate (e.g. 60 bpm) in accordance with the present disclosure. The computing system 701 could be an integrated component of the MR apparatus 700. The computing system 701 could alternatively be a unit of a desktop computer, a workstation, a server, a laptop computer, etc.

The method in accordance with the present disclosure may be performed by a stand-alone computer or network of computers that are not directly associated with an MR apparatus, which may likewise store or access program code stored on another device to perform the various methods and techniques described herein. The computer or network of computers may have a central processing unit (CPU) of a graphics processing unit (GPU) for performing the method according to the present disclosure. The CPU or GPU may be a parallel processor. Some or all of the aspects of the present disclosure may be parallelised using the parallel processor.

In summary, there is provided a method of determining coefficients for use in correcting a magnetic relaxation time constant, T, value obtained via magnetic resonance imaging when a pulse rate was at a first pulse rate value to a T value reflecting the T value that would have been obtained if the pulse rate was at a second pulse rate value. The method comprising, for each region of interest, pairing an obtained derivative, m, and an obtained intercept (offset), c, as an ordered pair (c, m) 201. The method comprising fitting the obtained plurality of ordered pairs (c, m) to a polynomial function 202. The method comprising determining the values of the coefficients from the polynomial function 203.

At least some of the example embodiments described herein may be constructed, partially or wholly, using dedicated special-purpose hardware. Terms such as 'component', 'module' or 'unit' used herein may include, but are not limited to, a hardware device, such as circuitry in the form of discrete or integrated components, a Field Programmable Gate Array (FPGA) or Application Specific Integrated Circuit (ASIC), which performs certain tasks or provides the associated functionality. In some embodiments, the described elements may be configured to reside on a tangible, persistent, addressable storage medium and may be configured to execute on one or more processors. These functional elements may in some embodiments include, by way of example, components, such as software components, object-oriented software components, class components and task components, processes, functions, attributes, procedures, subroutines, segments of program code, drivers, firmware, microcode, circuitry, data, databases, data structures, tables, arrays, and variables. Although the example embodiments have been described with reference to the components, modules and units discussed herein, such functional elements may be combined into fewer elements, or separated into additional elements.

The described and illustrated embodiments are to be considered as illustrative and not restrictive in character, it being understood that some example embodiments have been shown and described, and that all changes and modifications may be performed in accordance with these embodiments without departing from the sprit and scope of the disclosure. It should be understood that while the use of words such as "preferable", "preferably", "preferred" or "more preferred" in the description suggest that a feature so described may be desirable, it may nevertheless not be necessary and embodiments lacking such a feature may be contemplated as within the scope of the disclosure and/or as defined in the appended claims. In relation to the claims, it is intended that when words such as "a," "an," "at least one," or "at least one portion" are used to preface a feature there is no intention to limit the claim to only one such feature unless specifically stated to the contrary. When the language "at least a portion" and/or "a portion" is used the item can include a portion and/or the entire item unless specifically stated to the contrary.

Attention is directed to all papers and documents which are filed concurrently with or previous to this specification in connection with this application and which are open to public inspection with this specification, and the contents of all such papers and documents are incorporated herein by reference.

All of the features disclosed in this specification (including any accompanying claims, abstract and drawings), and/or all of the steps of any method or process so disclosed, may be combined in any combination, except combinations where at least some of such features and/or steps are mutually exclusive.

Each feature disclosed in this specification (including any accompanying claims, abstract and drawings) may be replaced by alternative features serving the same, equivalent or similar purpose, unless expressly stated otherwise. Thus, unless expressly stated otherwise, each feature disclosed is one example only of a generic series of equivalent or similar features.

The disclosure is not restricted to the details of the foregoing embodiment(s). The disclosure extends to any novel one, or any novel combination, of the features disclosed in this specification (including any accompanying claims, abstract and drawings), or to any novel one, or any novel combination, of the steps of any method or process so disclosed.

The invention claimed is:

1. A method of determining coefficients for correcting a magnetic relaxation time constant (T) value obtained via magnetic resonance (MR) imaging, the method comprising:

for each respective region of interest (ROI) from among a plurality of different ROIs associated with an MR imaged subject:
executing, via an excitation system of an MR imaging apparatus, one or more MR sequences;
obtaining, via a computing system of the MR imaging apparatus, a plurality of T values based upon the executed one or more MR sequences, each T value being associated with a different respective pulse rate value (P) to define a plurality of first ordered pairs (P, T);
fitting, via the computing system of the MR imaging apparatus, a monotonic mathematical function F(P) to the plurality of first ordered pairs (P, T), wherein an independent variable of the monotonic mathematical function is a pulse rate value P;
determining, via the computing system of the MR imaging apparatus, a value of one or more derivatives of order n, $$m^{(n)} = \frac{d^n F(P)}{dP^n},$$

of the monotonic mathematical function F(P) with respect to the independent variable P including at least the order n=1, where n is a positive integer;
determining, via the computing system of the MR imaging apparatus, an intercept value c of the monotonic mathematical function F(P) corresponding to the independent variable P being equal to zero; and
pairing, via the computing system of the MR imaging apparatus, each value of a derivative of order n with a corresponding intercept value c to define a plurality of second ordered pairs (c, $m^{(n)}$);
fitting, via the computing system of the MR imaging apparatus, a polynomial mathematical function of the form:

$$m^{(n)}(c) = \sum_{k=0}^{N} A_k^{(n)} c^k$$

where N is a positive integer, to the plurality of second ordered pairs (c, $m^{(n)}$);
determining, via the computing system of the MR imaging apparatus, from the polynomial mathematical function, the values of coefficients $A_k^{(n)}$; and
modifying, via the computing system of the MR imaging apparatus, using the coefficients $A_k^{(n)}$, the T value obtained via MR imaging in accordance with a first pulse rate value to a corrected value T', the corrected T' value being equivalent to a value that would be obtained if the first pulse rate was changed to a second, different pulse rate value.

2. A method as claimed in claim 1, wherein the monotonic mathematical function F(P) is a linear function of the form:

$$F(P)=m^{(1)}P+c,$$

wherein $m^{(1)}$ refers to a first-order derivative of the monotonic mathematical function F(P).

3. A method as claimed in claim 1, wherein:
the monotonic mathematical function F(P) is a quadratic function of the form:

$$F(P) = \frac{1}{2} m^{(2)} P^2 + m^{(1)} P + c,$$

$m^{(2)}$ refers to a second-order derivative of the monotonic mathematical function F(P), and
$m^{(1)}$ refers to a first-order derivative of the monotonic mathematical function F(P).

4. A method as claimed in claim 1, wherein:
the mathematical function is a polynomial mathematical function of the form:

$$F(P) = \sum_{n=1}^{L} \frac{1}{n!} m^{(n)} P^n + c,$$

$m^{(n)}$ refers to a derivative of order n of the monotonic mathematical function F(P), and
L is a positive integer.

5. A method as claimed in claim 1, further comprising:
determining a value of one or more derivatives of order n corresponding to the independent variable P being equal to zero by evaluating:

$$m^{(n)} = \frac{d^n F(P)}{dP^n}\bigg|_{P=0}.$$

6. A method as claimed in claim 1, further comprising:
using the obtained T value, the first pulse rate value P, and the polynomial function, $m^{(n)}(c)$, to modify the coefficients, $A_k^{(n)}$ of the polynomial mathematical function to provide a modified polynomial mathematical function;
determining a root of the modified polynomial function; and
using the determined root of the modified polynomial mathematical function as the determined intercept value c in the monotonic mathematical function F(P) to determine the corrected T value T' corresponding to the second pulse rate value.

7. A method as claimed in claim 6, wherein the monotonic mathematical function F(P) is a linear function of the form:

$$T=(A_2^{(1)}c^2+A_1^{(1)}c+A_0^{(1)})P+c.$$

8. A method as claimed in claim 1, wherein the monotonic mathematical function F(P) is a linear function, and further comprising:
using the intercept value c associated with the monotonic mathematical function F(P) to determine the corrected T value, T' by determining T' such that:

$$T' = T - \frac{P-sP}{P}(T-c),$$

where T' refers to the corrected T value, T refers to the obtained T value, P refers to the first pulse rate value, sP refers to the second pulse rate value, and c refers to the value of the intercept.

9. A method as claimed in claim 1, wherein the polynomial mathematical function is a quadratic function of the form:

$$m^{(1)}=A_2^{(1)}c^2+A_1^{(1)}c+A_0^{(1)}.$$

10. A method as claimed in claim 1, further comprising: determining a plurality of sets of coefficients $A_k^{(n)}$, and wherein each of the plurality of sets of coefficients $A_k^{(n)}$ is determined using a different respective ROI from among the plurality of different ROIs.

11. A method as claimed in claim 1, wherein the magnetic relaxation time constant T is a longitudinal magnetic relaxation time constant T1, and
wherein each respective ROI from among the plurality of different ROIs has substantially the same transverse magnetic relaxation time constant T2 value at a given pulse rate.

12. A method as claimed in claim 11, further comprising:
determining whether to correct the obtained T1 value using the determined coefficients $A_k^{(n)}$ based upon whether an obtained T2 value of the MR imaged subject is within a predetermined range of T2 values for the ROIs used in determining the coefficients $A_k^{(n)}$.

13. A method as claimed in claim 1, wherein the magnetic relaxation time constant T is a transverse magnetic relaxation time constant T2, and
wherein each respective ROI from among the plurality of different ROIs has substantially the same longitudinal magnetic relaxation time constant T1 value at a given pulse rate.

14. A method as claimed in claim 13, further comprising:
determining whether to correct the obtained T2 value using the determined coefficients $A_k^{(n)}$ based upon whether an obtained T1 value of the subject is within a predetermined range of T2 values for the ROIs used in determining the coefficients $A_k^{(n)}$.

15. A method as claimed in claim 1, wherein each respective one of the plurality of T values represents a different pixel in a T map.

16. The method according to claim 15, wherein when each respective one of the plurality of T values in the T map is corrected to a corrected T' value, a corrected T map is produced that corrects for variations in the plurality of T values when the one or more MR sequences are executed as a result of pulse rate variability.

17. A non-transitory, computer readable medium having instructions stored thereon which, when executed by a computing system of an MR apparatus, cause the computing system to determine coefficients for correcting a magnetic relaxation time constant (T) value obtained via magnetic resonance (MR) imaging by:
for each respective region of interest (ROI) from among a plurality of different ROIs associated with an MR imaged subject:
executing, via an excitation system of the MR imaging apparatus, one or more MR sequences;
obtaining, via the computing system of the MR imaging apparatus, a plurality of T values based upon the executed one or more MR sequences, each T value being associated with a different respective pulse rate value (P) to define a plurality of first ordered pairs (P, T);
fitting via the computing system of the MR imaging apparatus, a monotonic mathematical function F(P) to the plurality of first ordered pairs (P, T), wherein an independent variable of the monotonic mathematical function is a pulse rate value P;
determining via the computing system of the MR imaging apparatus, a value of one or more derivatives of order n, $$m^{(n)} = \frac{d^n F(P)}{dP^n},$$

of the monotonic mathematical function F(P) with respect to the independent variable P including at least the order n=1, where n is a positive integer;
determining via the computing system of the MR imaging apparatus, an intercept value c of the monotonic mathematical function F(P) corresponding to the independent variable P being equal to zero; and
pairing via the computing system of the MR imaging apparatus, each value of a derivative of order n with a corresponding intercept value c to define a plurality of second ordered pairs (c, $m^{(n)}$);
fitting, via the computing system of the MR imaging apparatus, a polynomial mathematical function of the form:

$$m^{(n)}(c) = \sum_{k=0}^{N} A_k^{(n)} c^k$$

where N is a positive integer, to the plurality of second ordered pairs (c, $m^{(n)}$);
determining, via the computing system of the MR imaging apparatus, from the polynomial mathematical function, the values of coefficients $A_k^{(n)}$; and
modifying, via the computing system of the MR imaging apparatus, using the coefficients $A_k^{(n)}$, the T value obtained via MR imaging in accordance with a first pulse rate value to a corrected value T', the corrected T' value being equivalent to a value that would be obtained if the first pulse rate was changed to a second, different pulse rate value.

* * * * *